(12) United States Patent
Yun et al.

(10) Patent No.: US 11,835,557 B2
(45) Date of Patent: Dec. 5, 2023

(54) FREQUENCY DETECTION CIRCUIT

(71) Applicant: SK hynix Inc., Gyeonggi-do (KR)

(72) Inventors: Dae-Ho Yun, Gyeonggi-do (KR); Seong-Jin Kim, Gyeonggi-do (KR)

(73) Assignee: SK hynix Inc., Seoul (KR)

( * ) Notice: Subject to any disclaimer, the term of this patent is extended or adjusted under 35 U.S.C. 154(b) by 363 days.

(21) Appl. No.: 16/663,829

(22) Filed: Oct. 25, 2019

(65) Prior Publication Data
US 2020/0132743 A1 Apr. 30, 2020

(30) Foreign Application Priority Data

Oct. 30, 2018 (KR) .......................... 10-2018-0130650

(51) Int. Cl.
*G01R 23/165* (2006.01)
*H03H 11/04* (2006.01)

(52) U.S. Cl.
CPC .......... *G01R 23/165* (2013.01); *H03H 11/04* (2013.01)

(58) Field of Classification Search
CPC .............................. G01R 23/165; H03H 11/04
See application file for complete search history.

(56) References Cited

U.S. PATENT DOCUMENTS

| | | | | |
|---|---|---|---|---|
| 4,686,585 A * | 8/1987 | Sato | ..................... | H04N 5/9205 386/307 |
| 4,831,441 A * | 5/1989 | Ando | ..................... | H04N 7/0105 348/441 |
| 4,922,343 A * | 5/1990 | Ando | ..................... | G01R 23/02 324/76.47 |
| 5,005,425 A * | 4/1991 | Ohmae | ..................... | G01F 1/3281 73/861.22 |
| 5,901,347 A * | 5/1999 | Chambers | ..................... | H03G 3/3052 455/234.1 |
| 2009/0103652 A1* | 4/2009 | Mabuchi | ..................... | H03F 1/56 375/316 |
| 2012/0313715 A1* | 12/2012 | Kargar | ..................... | H03D 13/00 331/34 |
| 2015/0303910 A1* | 10/2015 | Zhu | ..................... | H03K 9/08 329/312 |
| 2017/0336448 A1* | 11/2017 | Jang | ..................... | G01R 31/42 |
| 2018/0062680 A1* | 3/2018 | Massarella | ..................... | H04B 1/1027 |

FOREIGN PATENT DOCUMENTS

| | | |
|---|---|---|
| CN | 1288149 A | 3/2001 |
| CN | 1510860 A | 7/2004 |
| CN | 103235179 A | 8/2013 |
| KR | 10-2011-0107995 | 10/2011 |

OTHER PUBLICATIONS

Office Action issued by the Chinese Patent Office dated Oct. 8, 2021.

* cited by examiner

*Primary Examiner* — Jeff W Natalini
(74) *Attorney, Agent, or Firm* — IP & T GROUP LLP

(57) ABSTRACT

A frequency detection circuit may include a pulse generator configured to generate a pulse signal having a pulse width proportional to a cycle of a periodic wave to be measured; a low pass filter configured to selectively allow the pulse signal to pass therethrough; and a determination circuit configured to generate a frequency detection signal based on the pulse signal having passed through the low pass filter.

10 Claims, 7 Drawing Sheets

120

FREQUENCY DETECTION CIRCUIT

CROSS-REFERENCE TO RELATED APPLICATION

This application claims priority under 35 U.S.C. § 119 to Korean Patent Application No. 10-2018-0130650 filed on Oct. 30, 2018, which is incorporated herein by reference in its entirety.

BACKGROUND

1. Field

Various embodiments relate to a frequency detection circuit that detects a frequency of a periodic wave.

2. Discussion of the Related Art

Various integrated circuit chips operate in synchronization with a clock and support operations for various frequencies of the clock. For example, almost all memories operate in synchronization with a clock, and a frequency of the clock may be different according to the expected performance. For securing a correct operation of the integrated circuit chips while supporting the operations of various frequencies, it is necessary to detect the frequency of the clock inputted to the integrated circuit chips and to change an operation and control method according to the detected frequency. Accordingly, a frequency detection circuit that may accurately detect the frequency of a periodic wave such as a clock and has a simple structure, is required.

SUMMARY

Various embodiments are directed to a technology that accurately detects a frequency with a simple circuit configuration.

In an embodiment, a frequency detection circuit may include: a pulse generator configured to generate a pulse signal having a pulse width proportional to a cycle of a periodic wave to be measured; a low pass filter configured to selectively allow the pulse signal to pass therethrough; and a determination circuit configured to generate a frequency detection signal based on the pulse signal having passed through the low pass filter.

In an embodiment, a frequency detection circuit may include: a pulse generator configured to generate a pulse signal having a pulse width proportional to a cycle of a periodic wave to be measured; a first low pass filter configured to selectively allow the pulse signal to pass therethrough, and have a first cutoff frequency; a second low pass filter configured to selectively allow the pulse signal to pass therethrough, and have a second cutoff frequency different from the first cutoff frequency; and a determination circuit configured to generate plural frequency detection signals based on a first pulse signal having passed through the first low pass filter and a second pulse signal having passed through the second low pass filter.

In an embodiment, an integrated circuit may include: a pulse generator configured to generate a pulse signal having a pulse width corresponding to a period of a periodic signal; one or more low pass filters having different cutoff frequencies and configured to filter the pulse signal; and a determination circuit configured to determine a discrete frequency range of the periodic signal based on the filtered pulse signals, wherein each of the low pass filters includes one or more inverters that are serially coupled.

In an embodiment, a frequency detection circuit may include: a pulse generator configured to receive a periodic wave to generate a pulse signal having a pulse width corresponding to a cycle of the periodic wave; a first inverter chain configured to receive the pulse signal, wherein each of MOS transistors included in the first inverter chain has a first channel length; a second inverter chain configured to receive the pulse signal, wherein each of MOS transistors included in the second inverter chain has a second channel length greater than the first channel length; and a determination circuit configured to determine a frequency of the periodic wave based on wave forms of output signals of the first and second inverter chains.

In an embodiment, an operation method of an integrated circuit may include: generating a pulse signal having a pulse width corresponding to a period of a periodic signal; filtering the pulse signal through one or more low pass filters having different cutoff frequencies; and determining a discrete frequency range of the periodic signal based on the filtered pulse signals, wherein each of the low pass filters includes one or more inverters that are serially coupled.

In accordance with the embodiments, it is possible to detect the frequency of a periodic wave with a simple circuit configuration.

DETAILED DESCRIPTION

Figure 1:
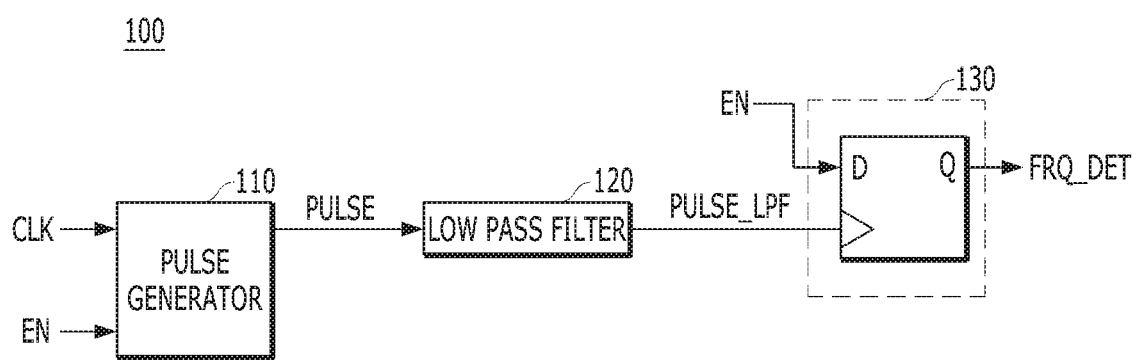
FIG. 1 is a block diagram illustrating a frequency detection circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the form of a singular form, the present embodiment is not limited thereto, but the corresponding components may also be represented in the form of a plural form.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

FIG. 1 is a block diagram a frequency detection circuit 100 in accordance with an embodiment of the present invention.

Referring to FIG. 1, the frequency detection circuit 100 may include a pulse generator 110, a low pass filter 120, and a determination circuit 130.

The pulse generator 110 may generate a pulse signal PULSE having a pulse width proportional to a cycle of a clock CLK that is a periodic wave. For example, the pulse generator 110 may generate a pulse signal PULSE having the same pulse width as one cycle of the clock CLK, a pulse signal PULSE having the same pulse width as two cycles of the clock CLK, or a pulse signal PULSE having the same pulse width as a half cycle of the clock CLK. Hereinafter, it is assumed that the pulse signal PULSE has the same pulse width as one cycle of the clock CLK for convenience of the explanation. The pulse generator 110 may be enabled by an enable signal EN.

The low pass filter 120 may selectively allow the pulse signal PULSE to pass therethrough. The low pass filter 120 is a filter that blocks a high frequency signal and allows a low frequency signal to pass therethrough. When the pulse width of the pulse signal PULSE is narrow, that is, when the pulse signal PULSE is a high frequency, the pulse signal PULSE may not reach a logic high level by the low pass filter 120. However, when the pulse width of the pulse signal PULSE is wide, that is, when the pulse signal PULSE is a low frequency, the pulse signal PULSE may reach a logic high level by the low pass filter 120. The pulse signal PULSE reaching a logic high level by the low pass filter 120 denotes that the pulse signal PULSE correctly pass through the low pass filter 120.

The determination circuit 130 may generate a frequency detection signal FRQ_DET by using a pulse signal PULSE_LPF having passed through the low pass filter 120. When an activation period (e.g., a logic high period) of the pulse signal PULSE_LPF having passed through the low pass filter 120 is detected, the determination circuit 130 may activate the frequency detection signal FRQ_DET, and when no logic high period of the pulse signal PULSE_LPF having passed through the low pass filter 120 is detected, the determination circuit 130 may deactivate the frequency detection signal FRQ_DET. When the frequency detection signal FRQ_DET is activated, it may represent that the frequency of the clock CLK is low, and when the frequency detection signal FRQ_DET is deactivated, it may represent that the frequency of the clock CLK is high. The determination circuit 130 may include a D flip-flop that receives the enable signal EN through a D terminal thereof, receives the pulse signal PULSE_LPF having passed through the low pass filter 120 through a clock terminal thereof, and outputs the frequency detection signal FRQ_DET through a Q terminal thereof. When the activation of the pulse signal PULSE_LPF having passed through the low pass filter 120 is detected, the determination circuit 130 may activate the frequency detection signal FRQ_DET to a high level.

Figure 2:
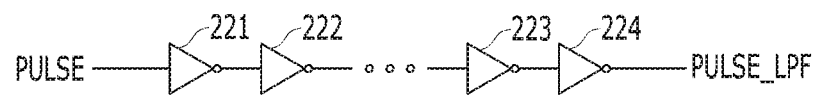
FIG. 2 is a detailed diagram of a low pass filter shown in FIG. 1.

FIG. 2 is a detailed diagram of the low pass filter 120 shown in FIG. 1.

Referring to FIG. 2, the low pass filter 120 may include an inverter chain. That is, the low pass filter 120 may include a plurality of inverters 221 to 224 serially connected to one another. In order to allow the shapes of the pulse signal PULSE and the pulse signal PULSE_LPF to be substantially identical to each other, it is preferable that the number of the inverters 221 to 224 is an even number; however, the number of the inverters 221 to 224 may be an odd number.

Each of the inverters 221 to 224 may include a PMOS transistor and an NMOS transistor forming a CMOS inverter. The longer the channel lengths of the PMOS transistor and the NMOS transistor, the lower the cutoff frequency of the low pass filter 120.

FIG. 2 illustrates an example in which the low pass filter 120 includes the inverters 221 to 224; however, it is of course that the low pass filter 120 may include other types of active elements, and/or may include a resistor, a capacitor and the like.

Figure 3:
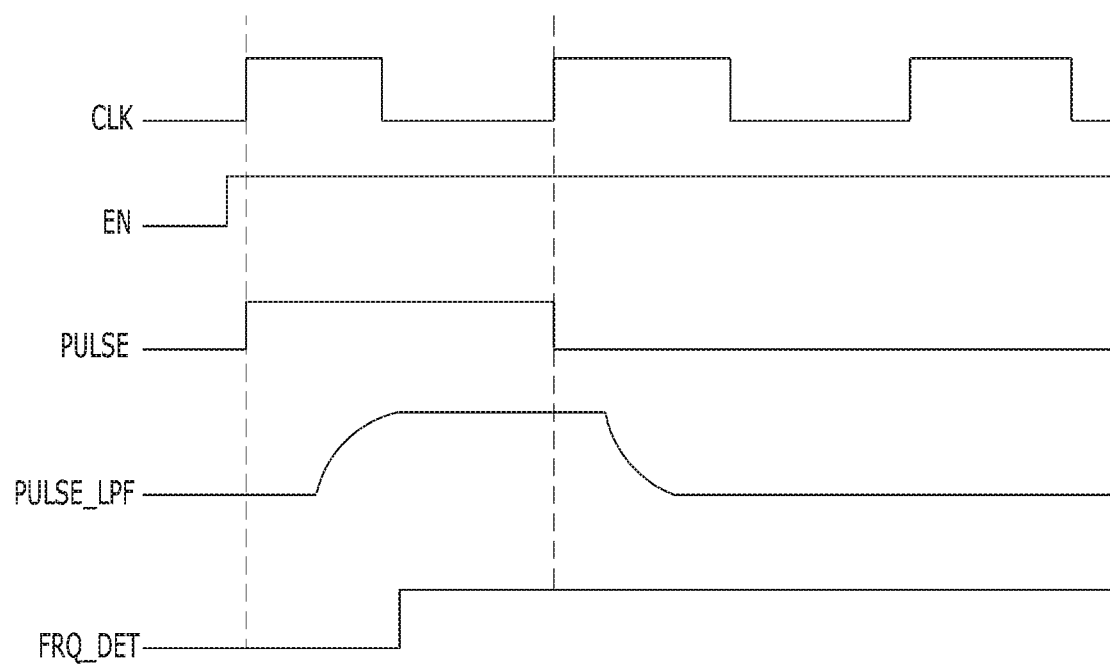
FIGS. 3 and 4 are wave form diagrams for describing an operation of the frequency detection circuit shown FIGS. 1 and 2.
Figure 4:
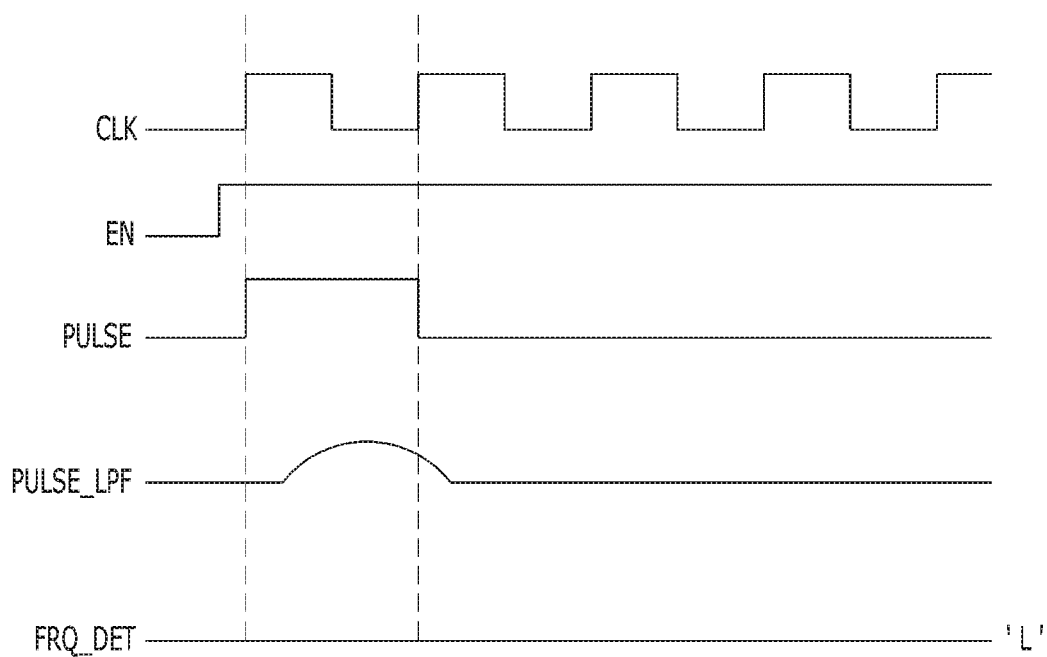

FIGS. 3 and 4 are wave form diagrams or describing an operation of the frequency detection circuit 100 of FIG. 1. Specifically, FIG. 3 illustrates the operation of the frequency detection circuit 100 when the frequency of the clock CLK is low, and FIG. 4 illustrates the operation of the frequency detection circuit 100 when the frequency of the clock CLK is high.

Referring to FIG. 3, when the enable signal EN is activated, the pulse generator 110 may generate the pulse signal PULSE having a pulse width corresponding to one cycle of the clock CLK. The pulse signal PULSE may pass through the low pass filter 120. Since the pulse width of the pulse signal PULSE is wide, the pulse signal PULSE_LPF having passed through the low pass filter 120 may reach its logic high level, the logic high period of the pulse signal PULSE_LPF may be detected by the determination circuit 130, and the determination circuit 130 may activate the frequency detection signal FRQ_DET to a high level.

Referring to FIG. 4, when the enable signal EN is activated, the pulse generator 110 may generate the pulse signal PULSE having a pulse width corresponding to one cycle of the clock CLK. The pulse signal PULSE may pass through the low pass filter 120. Since the pulse width of the pulse signal PULSE is narrow, the pulse signal PULSE_LPF having passed through the low pass filter 120 may not reach its logic high level. The logic high period of the pulse signal PULSE_LPF may not be detected by the determination circuit 130, and the determination circuit 130 may continuously deactivate the frequency detection signal FRQ_DET to a low level.

Figure 5:
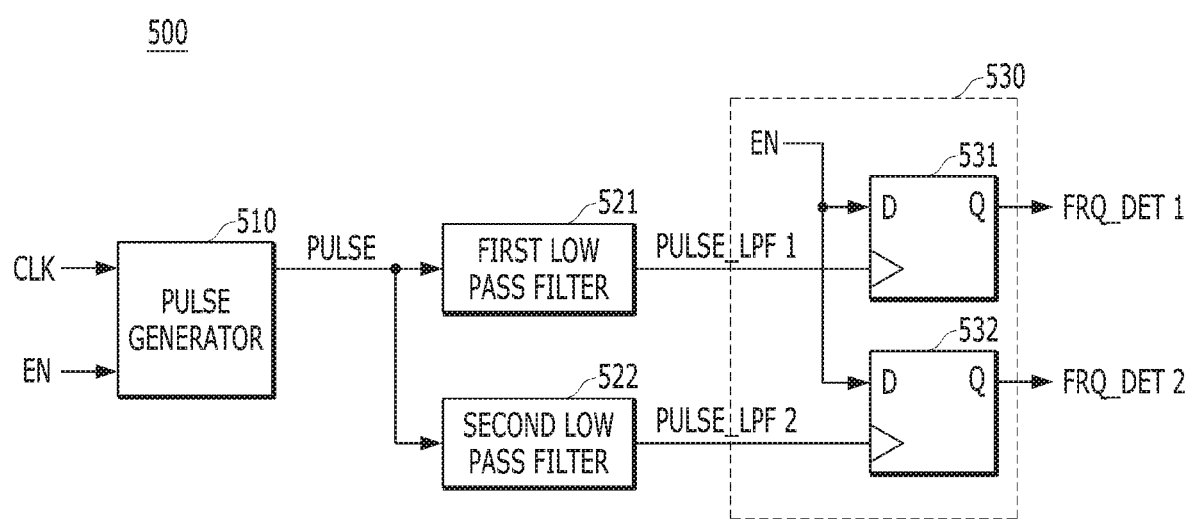
FIG. 5 is a block diagram illustrating a frequency detection circuit in accordance with another embodiment of the present invention.

FIG. 5 is a block diagram of a frequency detection circuit 500 in accordance with another embodiment of the present invention.

Referring to FIG. 5, the frequency detection circuit 500 may include a pulse generator 510, a first low pass filter 521, a second low pass filter 522, and a determination circuit 530.

The pulse generator 510 may generate a pulse signal PULSE having a pulse width proportional to a cycle of a clock CLK that is a periodic wave. For example, the pulse generator 510 may generate a pulse signal PULSE having the same pulse width as one cycle of the clock CLK, a pulse signal PULSE having the same pulse width as two cycles of the clock CLK, or a pulse signal PULSE having the same pulse width as a half cycle of the clock CLK. Hereinafter, it is assumed that the pulse signal PULSE has the same pulse width as one cycle of the clock CLK for convenience of the explanation. The pulse generator 510 may be enabled by an enable signal EN.

Each of the first low pass filter 521 and the second low pass filter 522 may selectively allow the pulse signal PULSE to pass therethrough. A first pulse signal PULSE_LPF1 may be a pulse signal having passed through the first low pass filter 521 and a second pulse signal PULSE_LPF2 may be a pulse signal having passed through the second low pass filter 522. The first low pass filter 521 and the second low pass filter 522 may have cutoff frequencies different from each other. That is, the cutoff frequency of the second low pass filter 522 may be lower than that of the first low pass filter 521. When the frequency of the clock CLK is low, the pulse signal PULSE may reach a logic high level by both of the first low pass filter 521 and the second low pass filter 522. Furthermore, when the frequency of the clock CLK is intermediate, the pulse signal PULSE may reach a logic high level by the first low pass filter 521, but may not reach a logic high level by the second low pass filter 522. Furthermore, when the frequency of the clock CLK is high, the pulse signal PULSE may not reach a logic high level by both of the first low pass filter 521 and the second low pass filter 522.

Each of the first low pass filter 521 and the second low pass filter 522 may include inverters serially connected to one another as illustrated in FIG. 2. Since the cutoff frequency of the second low pass filter 522 is lower than that of the first low pass filter 521, channel lengths of PMOS transistors included in the inverters of the first low pass filter 521 may be shorter than those of PMOS transistors included in the inverters of the second low pass filter 522. Furthermore, channel lengths of NMOS transistors included in the inverters of the first low pass filter 521 may be shorter than those of NMOS transistors included in the inverters of the second low pass filter 522.

The determination circuit 530 may generate a first frequency detection signal FRQ_DET1 and a second frequency detection signal FRQ_DET2 by using the first pulse signal PULSE_LPF1 and the second pulse signal PULSE_LPF2. When a logic high period of the first pulse signal PULSE_LPF1 is detected, the determination circuit 530 may activate the first frequency detection signal FRQ_DET1, and when a logic high period of the second pulse signal PULSE_LPF2 is detected, the determination circuit 530 may activate the second frequency detection signal FRQ_DET2. The determination circuit 530 may include a first D flip-flop 531 that receives the enable signal EN through a D terminal thereof, receives the first pulse signal PULSE_LPF1 through a clock terminal thereof, and outputs the first frequency detection signal FRQ_DET1 through a Q terminal thereof, and a second D flip-flop 532 that receives the enable signal EN through a D terminal thereof, receives the second pulse signal PULSE_LPF2 through a clock terminal thereof, and outputs the second frequency detection signal FRQ_DET2 through a Q terminal thereof.

When both of the first frequency detection signal FRQ_DET1 and the second frequency detection signal FRQ_DET2 are activated, it may represent that the frequency of the clock CLK is low. Furthermore, when the first frequency detection signal FRQ_DET1 is activated and the second frequency detection signal FRQ_DET2 is deactivated, it may represent that the frequency of the clock CLK is intermediate. Furthermore, when both of the first frequency detection signal FRQ_DET1 and the second frequency detection signal FRQ_DET2 are deactivated, it may represent that the frequency of the clock CLK is high. That is, the determination circuit 530 may determine a discrete frequency range ("low", "intermediate" or "high") of the clock CLK.

Figure 6:
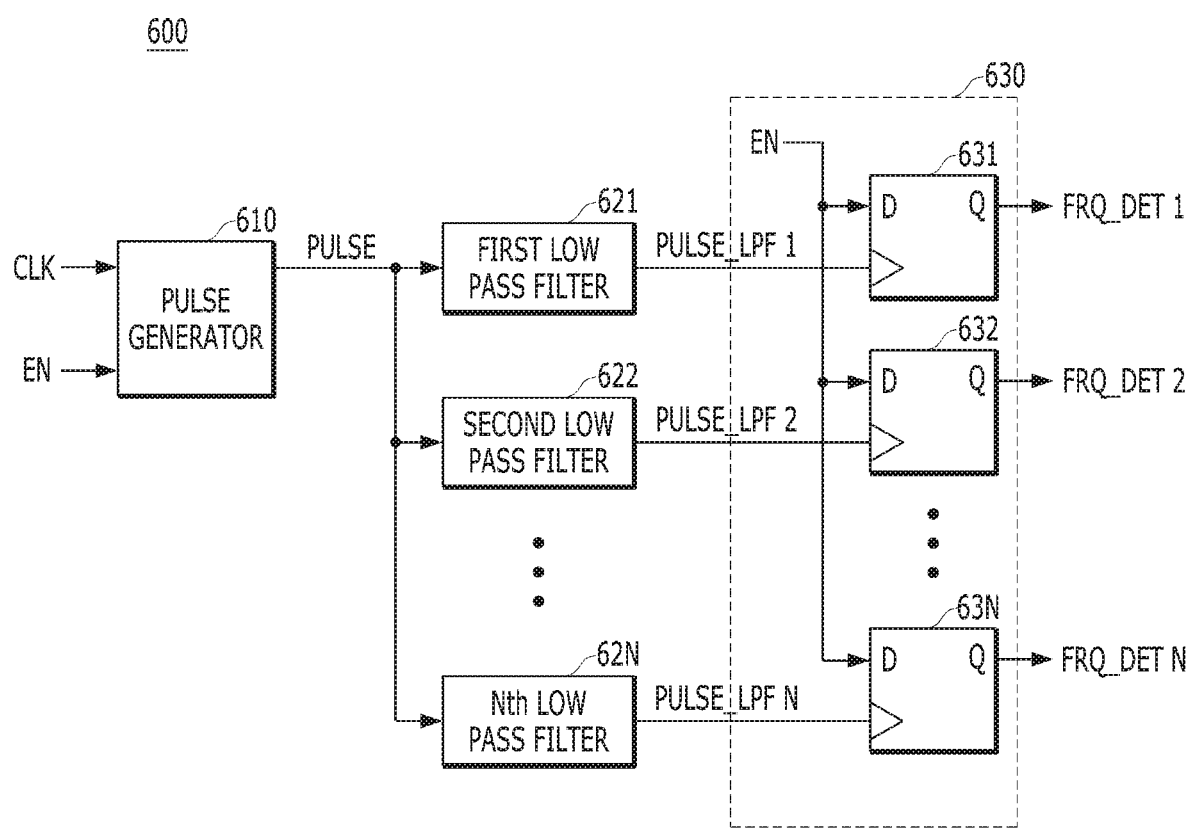
FIG. 6 is a block diagram illustrating a frequency detection circuit in accordance with still another embodiment of the present invention.
Figure 7:
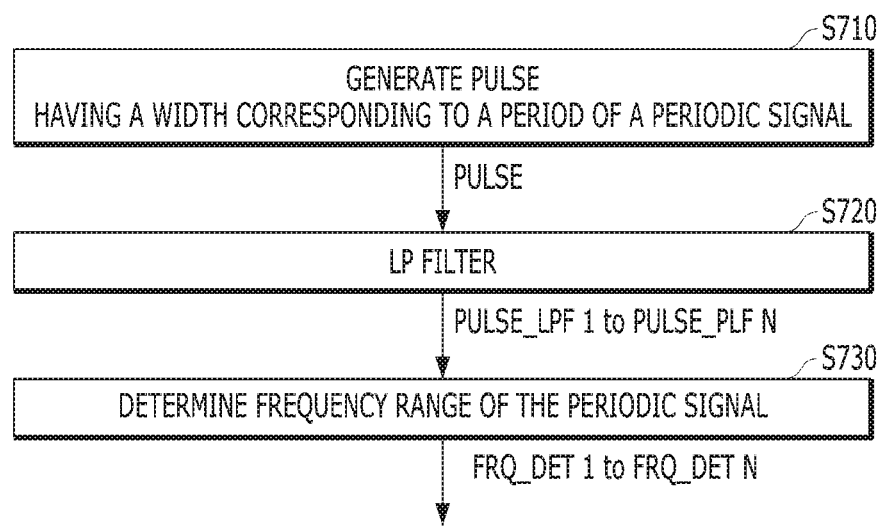
FIG. 7 is a flowchart for describing an operation of the frequency detection circuit shown in FIG. 6.

FIG. 6 is a block diagram of a frequency detection circuit 600 in accordance with still another embodiment of the present invention. FIG. 7 is a flowchart for describing an operation of the frequency detection circuit 600 shown in FIG. 6.

Referring to FIG. 6, the frequency detection circuit 600 may include a pulse generator 610, first to N-th low pass filters 621 to 62N, and a determination circuit 630.

Referring to FIGS. 6 and 7, the pulse generator 610 at step S710 may generate a pulse signal PULSE having a pulse width corresponding to a period of a clock CLK or a periodic signal. For example, the pulse generator 610 may generate a pulse signal PULSE having the same pulse width as a single period of the clock CLK. The pulse generator 610 may be activated by an enable signal EN.

At step S720, the first to N-th low pass filters 621 to 62N may output filtered pulse signals PULSE_LPF 1 to PULSE_LPF N by filtering the pulse signal PULSE, respectively. The first to N-th low pass filters 621 to 62N may have different cutoff frequencies. The pulse signal PULSE may reach a logic high level by one or more low pass filters having the cutoff frequencies higher than the frequency of the clock CLK or the periodic signal among the filtered pulse signals PULSE_LPF 1 to PULSE_LPF N. The pulse signal PULSE may not reach a logic high level by one or more low pass filters having the cutoff frequencies lower than the frequency of the clock CLK or the periodic signal among the filtered pulse signals PULSE_LPF 1 to PULSE_LPF N. That is, among the first to N-th low pass filters 621 to 62N, one or more low pass filters may output corresponding filtered pulse signals having a logic high level period while the others may output corresponding filtered pulse signals not having a logic high level period.

Each of the first to N-th low pass filters 621 to 62N may include inverters serially connected to one another as illustrated in FIG. 2. Channel lengths of transistors included in the inverters of the low pass filters having a higher cutoff frequency may be shorter than those of transistors included in the inverters of the low pass filters having a lower cutoff frequency.

A number of the first to N-th low pass filters 621 to 62N with a constant difference among the cutoff frequencies may determine a total frequency range to be determined. The first to N-th low pass filters 621 to 62N may correspond to 'N+1' number of discrete frequency ranges. The greater the number of the first to N-th low pass filters 621 to 62N with a constant difference among the cutoff frequencies, the wider the total frequency range to be determined. An amount of difference among the different cutoff frequencies with fixed number of the first to N-th low pass filters 621 to 62N may determine a resolution of the discrete frequency range of the periodic signal CLK. The narrower the difference among the different cutoff frequencies, the finer the resolution of the discrete frequency range of the periodic signal CLK.

At step S730, the determination circuit 630 may determine a discrete frequency range of the periodic signal CLK based on the filtered pulse signals PULSE_LPF 1 to PULSE_LPF N.

When a logic high period of one among the filtered pulse signals PULSE_LPF 1 to PULSE_LPF N is detected, the determination circuit 630 may activate a corresponding one among first to N-th frequency detection signals FRQ_DET 1 to FRQ_DET N. The determination circuit 630 may include first to N-th D flip-flops 631 to 63N respectively corresponding to the filtered pulse signals PULSE_LPF 1 to PULSE_LPF N. Each of the D flip-flops 631 to 63N may receive the enable signal EN through a D terminal thereof, may receive a corresponding one among the filtered pulse signals PULSE_LPF 1 to PULSE_LPF N through a clock terminal thereof, and outputs a corresponding one among the first to N-th frequency detection signals FRQ_DET 1 to FRQ_DET N through a Q terminal thereof.

Among the filtered pulse signals PULSE_LPF 1 to PULSE_LPF N, one or more filtered pulse signals may have a logic high level period while the other filtered pulse signals may not have a logic high level period. Among the filtered pulse signals PULSE_LPF 1 to PULSE_LPF N, two neighboring filtered pulses, one of which has a logic high level period and the other of which does not have a logic high level period, may represent a discrete frequency range of the periodic signal CLK. The neighboring filtered pulses may be output from the low pass filters having neighboring cutoff frequencies among the first to N-th low pass filters 621 to 62N.

Therefore, among the first to N-th frequency detection signals FRQ_DET 1 to FRQ_DET N, two neighboring frequency detection signals, one of which is activated and the other of which is not activated, may represent a discrete frequency range of the periodic signal CLK. The neighboring frequency detection signals may correspond to the neighboring filtered pulses output from the low pass filters having neighboring cutoff frequencies among the first to N-th low pass filters 621 to 62N.

The determination circuit 630 may determine the discrete frequency range of the periodic signal CLK through the neighboring frequency detection signals, one of which is activated and the other of which is not activated.

Although various embodiments have been described for illustrative purposes, it will be apparent to those skilled in the art that various changes and modifications may be made without departing from the spirit and scope of the invention as defined in the following claims.

What is claimed is:

1. A frequency detection circuit comprising:
a pulse generator configured to generate a pulse signal having a pulse width proportional to a cycle of a periodic wave whose frequency is to be measured;
a first low pass filter configured to selectively allow the pulse signal to pass therethrough, and have a first cutoff frequency;
a second low pass filter configured to selectively allow the pulse signal to pass therethrough, and have a second cutoff frequency different from the first cutoff frequency; and
a determination circuit configured to generate plural frequency detection signals based on a first pulse signal having passed through the first low pass filter and a second pulse signal having passed through the second low pass filter,
wherein the determination circuit generates a first frequency detection signal by detecting activation or deactivation of the first pulse signal, and generates a second frequency detection signal by detecting activation or deactivation of the second pulse signal,
wherein when the first frequency detection signal and the second frequency detection signal are activated, it is determined that a frequency of the periodic wave is low,
wherein when the first frequency detection signal is activated and of the second frequency detection signal is deactivated, it is determined that the frequency of the periodic wave is intermediate, wherein when the first frequency detection signal and the second frequency detection signal are deactivated it is determined that the frequency of the periodic wave is high,
wherein the first low pass filter and the second low pass filter are filters that blocks a pulse signal having a high frequency and allow a pulse signal having a low frequency to pass therethrough,
wherein when the periodic wave is a high frequency, the pulse signal does not reach a logic high level by the first low pass filter and the second low pass filter so that the frequency detection signal is deactivated, and
wherein when the periodic wave is a low frequency, the pulse signal reaches a logic high level by the first low pass filter and the second low pass filter so that the frequency detection signal is activated.

2. The frequency detection circuit of claim 1,
wherein the first low pass filter includes a plurality of first inverters,
wherein the second low pass filter includes a plurality of second inverters,
wherein channel lengths of PMOS transistors included in the plurality of first inverters are shorter than channel lengths of PMOS transistors included in the plurality of second inverters, and
wherein channel lengths of NMOS transistors included in the plurality of first inverters are shorter than channel lengths of NMOS transistors included in the plurality of second inverters.

3. The frequency detection circuit of claim 1, wherein the determination circuit comprises:
a first D flip-flop configured to receive an enable signal through a D terminal thereof, receive the first pulse signal through a clock terminal thereof, and output the first frequency detection signal through a Q terminal thereof; and
a second D flip-flop configured to receive the enable signal through a D terminal thereof, receive the second pulse signal through a clock terminal thereof, and output the second frequency detection signal through a Q terminal thereof.

4. An integrated circuit comprising:
a pulse generator configured to generate a pulse signal having a pulse width corresponding to a period of a periodic signal whose frequency is to be measured;
two or more low pass filters having different cutoff frequencies and configured to filter the pulse signal to generate a plurality of filtered pulse signals, wherein each filtered pulse signal respectively corresponds to each of the low pass filters; and
a determination circuit configured to determine a discrete frequency range of the periodic signal based on the plurality of filtered pulse signals,
wherein each of the low pass filters includes one or more inverters that are serially coupled,
wherein among the plurality of filtered pulse signals, two neighboring filtered pulses, one of which has a logic high level period and the other of which does not have a logic high level period, represents the discrete frequency range of the periodic signal,
wherein the two or more low pass filters are filters that block a pulse signal having a high frequency and allow a pulse signal having a low frequency to pass therethrough, wherein when the periodic signal is a high frequency, the pulse signal does not reach a logic high level by the two or more low pass filters so that the frequency detection signal is deactivated, and wherein when the periodic signal is a low frequency, the pulse signal reaches a logic high level by the two or more low pass filters so that the frequency detection signal is activated.

5. The integrated circuit of claim 4, wherein the inverters include one or more transistors.

6. The integrated circuit of claim 5, wherein the inverters have different channel lengths.

7. The integrated circuit of claim 4, wherein the determination circuit includes one or more D flip-flops respectively corresponding to the low pass filters, and wherein each of the D flip-flops receives an enable signal through a D terminal thereof and a corresponding one among the plurality of filtered pulse signals through a clock terminal thereof, and outputs a frequency detection signal through a Q terminal thereof.

8. An operating method of an integrated circuit, the operating method comprising:

generating a pulse signal having a pulse width corresponding to a period of a periodic signal whose frequency is to be measured;

filtering the pulse signal through two or more low pass filters having different cutoff frequencies to generate a plurality of filtered pulse signals, wherein each filtered pulse signal respectively corresponds to each of the low pass filters; and determining the frequency of the periodic signal based on among the plurality of filtered pulse signals, two neighboring filtered pulses, one of which has a logic high level period and the other of which does not have a logic high level period, wherein each of the low pass filters includes one or more inverters that are serially coupled, wherein the two or more low pass filters are filters that block a pulse signal having a high frequency and allow a pulse signal having a low frequency to pass therethrough, wherein when the periodic signal is a high frequency, the pulse signal does not reach a logic high level by the two or more low pass filters so that the frequency detection signal is deactivated, and wherein when the periodic signal is a low frequency, the pulse signal reaches a logic high level by the two or more low pass filters so that the frequency detection signal is activated.

9. The operating method of claim 8, wherein the inverters include one or more transistors.

10. The operating method of claim 9, wherein the inverters have different channel lengths.

* * * * *